(12) United States Patent
Akram

(10) Patent No.: US 7,511,262 B2
(45) Date of Patent: Mar. 31, 2009

(54) OPTICAL DEVICE AND ASSEMBLY FOR USE WITH IMAGING DIES, AND WAFER-LABEL IMAGER ASSEMBLY

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/209,524

(22) Filed: Aug. 22, 2005

(65) Prior Publication Data

US 2006/0043262 A1 Mar. 2, 2006

Related U.S. Application Data

(60) Provisional application No. 60/605,565, filed on Aug. 30, 2004.

(51) Int. Cl.
*H01J 5/02* (2006.01)
(52) U.S. Cl. .................... 250/239; 257/434
(58) Field of Classification Search ........... 250/239; 257/434, 680; 438/65, 106, 116; 348/340
See application file for complete search history.

(56) References Cited

U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |

(Continued)

FOREIGN PATENT DOCUMENTS

EP 0 886 323 12/1998

(Continued)

OTHER PUBLICATIONS

U.S. Appl. No. 10/785,466, Kirby.

(Continued)

*Primary Examiner*—Thanh X Luu
(74) *Attorney, Agent, or Firm*—Dickstein Shapiro LLP

(57) ABSTRACT

Microelectronic imagers with integrated optical devices and methods for manufacturing imagers. The imagers, for example, typically have an imaging unit including a first substrate and an image sensor on and/or in the first substrate. An embodiment of an optical device includes a stand-off having a compartment configured to contain the image sensor. The stand-off has a coefficient of thermal expansion at least substantially the same as that of the first substrate. The optical device can further include an optics element in alignment with the compartment of the stand-off. The stand-off can be formed by etching a compartment into a silicon wafer or a wafer of another material having a coefficient of thermal expansion at least substantially the same as that of the substrate upon which the image sensor is formed. The optics elements can be formed integrally with the stand-offs or separately attached to a cover supported by the stand-offs.

14 Claims, 13 Drawing Sheets

U.S. PATENT DOCUMENTS

| | | | |
|---|---|---|---|
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,483,030 B1 * | 11/2002 | Glenn et al. | 174/521 |
| 6,483,652 B2 | 11/2002 | Nakamura | |
| 6,503,780 B1 | 1/2003 | Glenn et al. | |
| 6,541,762 B2 | 4/2003 | Knag et al. | |
| 6,559,439 B1 * | 5/2003 | Tsuchida et al. | 250/239 |
| 6,560,047 B2 | 5/2003 | Choi et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,864,172 B2 | 4/2004 | Noma et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 7,074,638 B2 * | 7/2006 | Maeda et al. | 438/75 |
| 7,330,211 B2 * | 2/2008 | Vook et al. | 348/340 |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0236708 A1 | 10/2005 | Farnworth et al. | |
| 2005/0254133 A1 | 11/2005 | Akram et al. | |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterization," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

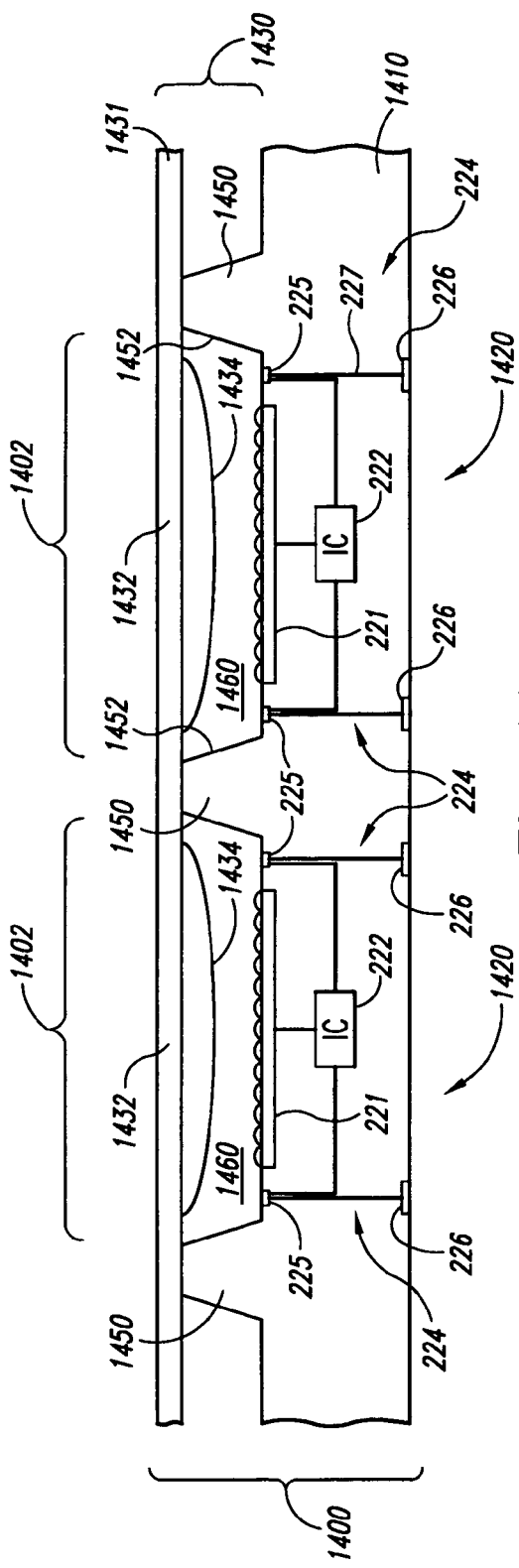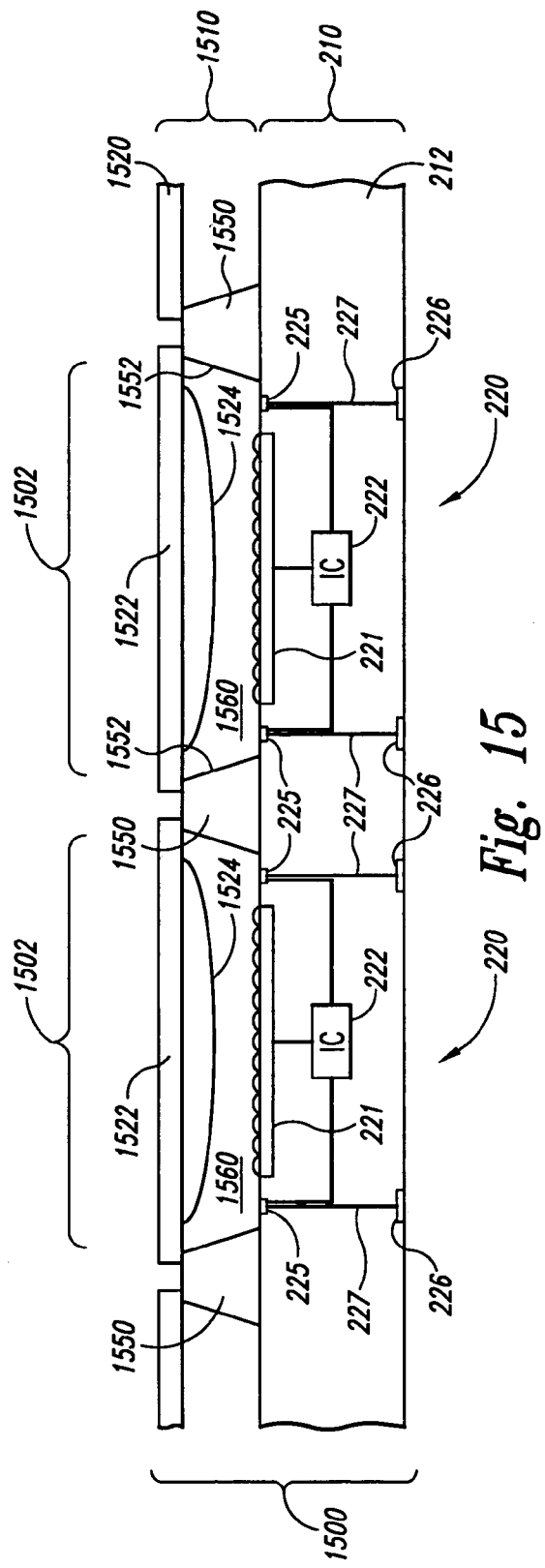

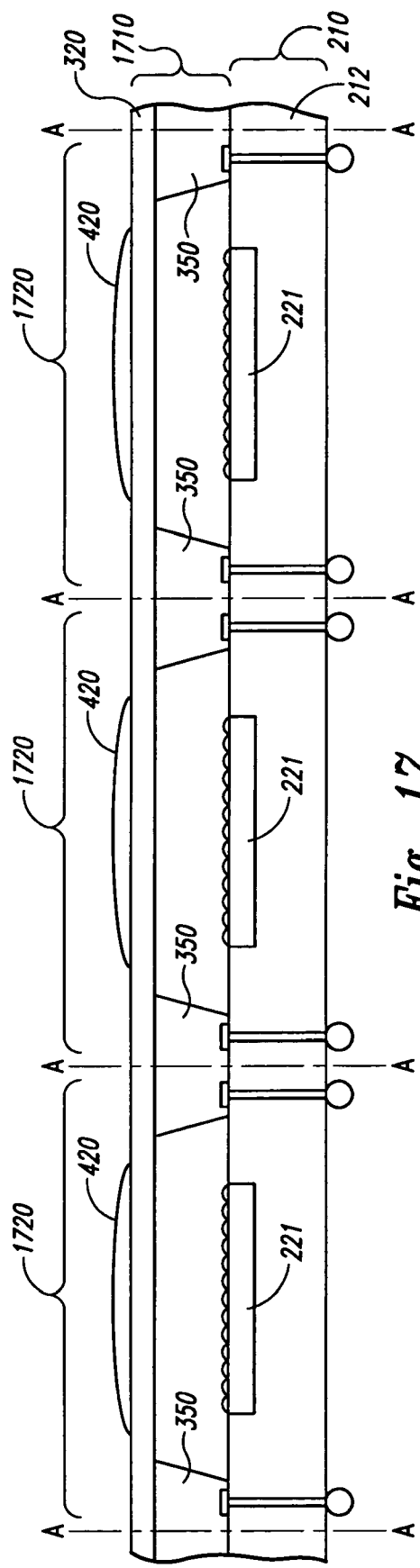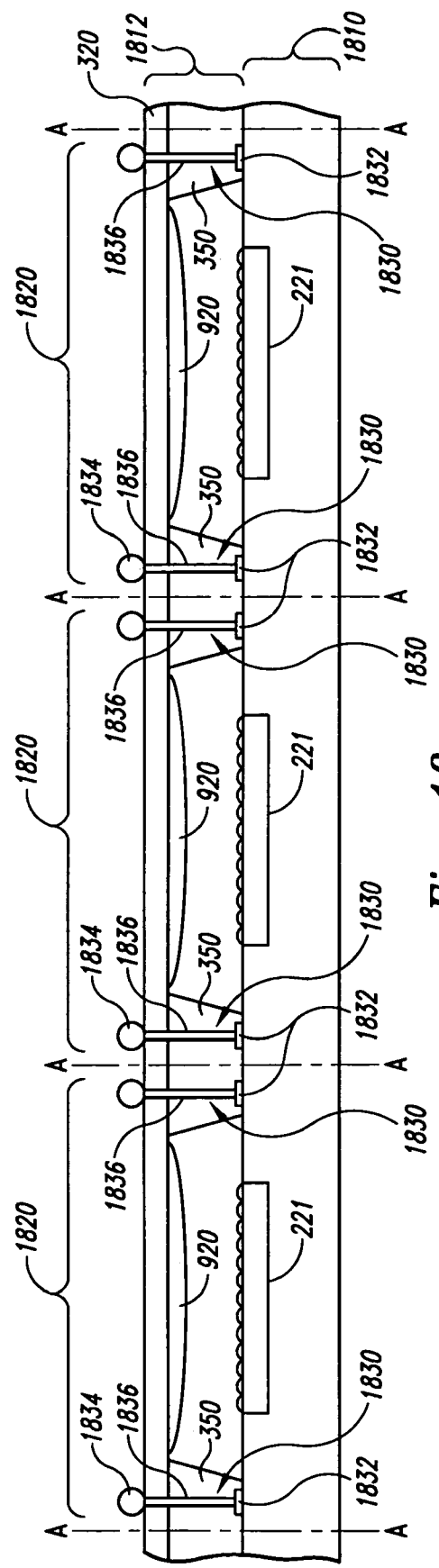

OPTICAL DEVICE AND ASSEMBLY FOR USE WITH IMAGING DIES, AND WAFER-LABEL IMAGER ASSEMBLY

CROSS-REFERENCE TO RELATED APPLICATION

This application claims the benefit of U.S. Provisional Patent Application No. 60/605,565 filed Aug. 30, 2004, which is incorporated herein by reference in its entirety.

TECHNICAL FIELD

The present invention is related to microelectronic imagers and methods for packaging microelectronic imagers. Several aspects of the present invention are directed toward optical devices including stand-offs having a coefficient of thermal expansion that is at least substantially the same as that of the substrate upon which the image sensors are fabricated. Additional aspects of the invention are directed toward installing such optical devices and wafer-level packaging of microelectronic imagers.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10, and a housing 30 attached to the interposer 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer 20 by wire-bonds 28 to provide electrical pathways between the bond-pads 14 and the ball-pads 24. The interposer 20 can also be a lead frame or ceramic housing.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 µm of the centerline of the image sensor 12. This is difficult to achieve with conventional imagers because the support 50 may not be positioned accurately on the housing 30. Moreover, because the barrel 60 is threaded onto the support 50, the necessary clearance between the threads can cause misalignment between the axes of the support 50 and the housing 60. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator manually rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is that they have relatively large footprints and occupy a significant amount of vertical space (i.e., high profiles). The footprint of the imager in FIG. 1 is the surface area of the bottom of the interposer 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. The conventional imager 1 shown in FIG. 1 is also expensive because each cover 40 is individually attached to the housing 30, and each housing 30 is individually attached to an interposer 20. Moreover, the support 50 and barrel 60 are assembled separately for each die 10 individually after the dies have been singulated from a wafer and attached to the interposer 20. Therefore, there is a significant need to enhance the efficiency, reliability and precision of packaging microelectronic imagers.

Still another concern of convention microelectronic imagers is that they are subject to failures caused by contaminants getting into the enclosed spaces of the housing 30 and the barrels 60. More specifically, moisture or other contaminants can enter into such enclosed spaces because leaks can develop along the interfaces between the interposer 20, housing 30, support 50, and barrel 60. The image sensor 12, cover 40 and lens 70 can also be contaminated by outgassing over time.

Therefore, there is also a significant need to produce more robust packages that are not prone to leaking and outgassing.

BRIEF DESCRIPTION OF THE DRAWINGS

FIG. 14 is a schematic side cross-sectional view illustrating a wafer-level assembly of microelectronic imagers packaged in accordance with an embodiment of the invention.

FIG. 15 is a schematic side cross-sectional view illustrating a wafer-level assembly of microelectronic imagers packaged in accordance with an embodiment of the invention.

FIG. 17 is a schematic side cross-sectional view illustrating a wafer-level assembly of microelectronic imagers assembled in accordance with an embodiment of the invention.

FIG. 18 is a schematic side cross-sectional view illustrating a wafer-level assembly of microelectronic imagers assembled in accordance with an embodiment of the invention.

DETAILED DESCRIPTION

A. Overview

Figure 1:
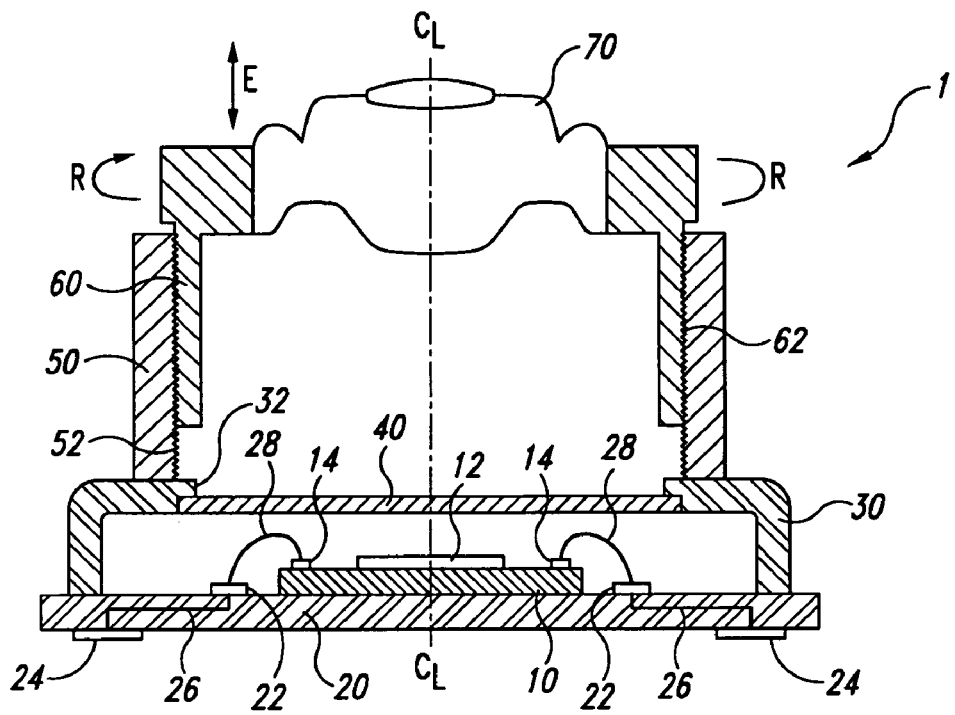
FIG. 1 is a schematic cross-sectional view of a packaged microelectronic imager in accordance with the prior art.

The following disclosure describes several embodiments of microelectronic imagers with integrated optical devices and methods for manufacturing such microelectronic imagers. One aspect of the invention is directed toward methods of manufacturing integrated optical devices for use in microelectronic imagers. The microelectronic imagers, for example, typically have an imaging unit including a first substrate and an image sensor on and/or in the first substrate. An embodiment of one such method for fabricating an optical device comprises forming a stand-off having a compartment configured to contain the image sensor. The stand-off has a coefficient of thermal expansion at least substantially the same as that of the first substrate. This method further includes fixedly positioning an optics element in alignment with the compartment of the stand-off. As explained in more detail below, the stand-off can be formed by etching a compartment into a silicon wafer or a wafer of another material having a coefficient of thermal expansion at least substantially the same as that of the substrate upon which the image sensor is formed. The optics elements can be fixedly positioned in alignment with the compartments of the stand-offs by forming the optics elements integrally with the stand-offs or attaching the optics elements to a plate or other layer of material supported by the stand-offs.

Another aspect of the invention is directed toward a microelectronic imager having an optical device. One embodiment of such a microelectronic imager comprises an imaging unit having an image sensor formed on and/or in a first substrate and a plurality of external contacts on the first substrate. The external contacts are operably coupled to the image sensor. The microelectronic imager further comprises an optical device having a stand-off attached to the first substrate. The stand-off includes a compartment in which the image sensor is positioned, and the stand-off has a coefficient of thermal expansion that is at least approximately the same as that of the first substrate. The stand-off, for example, can be composed of silicon, silicon dioxide, gallium arsenide, or other III-V semiconductor compounds. The optical devices can further include an optics element fixedly positioned in alignment with the compartment of the stand-off. The optics element can be formed integrally with the stand-off or be a separate component that is attached to the stand-off. The optics element, for example, can be a focus lens, a dispersion lens, a pin-hole lens, anti-reflective coatings and/or filters.

Several details of specific embodiments of the invention are described below with reference to CMOS imagers to provide a thorough understanding of these embodiments. CCD imagers, other types of imagers, or other types of sensors, however, can be used instead of the CMOS imagers in other embodiments of the invention. Several details describing structures that are often associated with microelectronic devices may not be set forth in the following description for the purposes of brevity. Moreover, other embodiments of the invention can have different configurations or include different components than those described in this section. Such other embodiments of the invention may accordingly have additional elements or may not include all the elements shown and described below with reference to FIGS. 2A-18.

B. Microelectronic Imagers Packaged at the Wafer Level

Figure 2A:
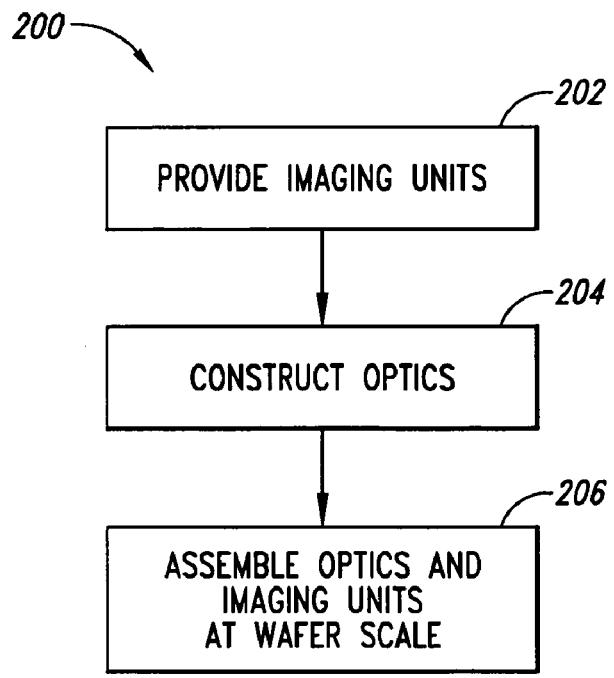
FIG. 2A is a flow chart illustrating a method of wafer-level packaging of microelectronic imagers in accordance with one embodiment of the invention.

FIG. 2A is a flow chart of a wafer-level packaging process 200 for packaging a plurality of microelectronic imagers. The packaging process 200 includes an imaging unit procedure 202, an optics procedure 204, and an assembly procedure 206.

The imaging unit procedure 202 comprises providing an imager workpiece having a first substrate and a plurality of imaging units on and/or in the first substrate. The imaging units can each include an image sensor and a plurality of external electrical contacts operatively coupled to the image sensor. For example, the external contacts can be arrays of backside contact pads coupled to corresponding image sensors by through-wafer interconnects.

The optics procedure 204 comprises providing an optical device workpiece having a second substrate and a plurality of optical devices on and/or in the second substrate. The optical devices are typically arranged in a pattern corresponding to the pattern of the imaging units on the first substrate. The optical devices include a stand-off composed of a material having a coefficient of thermal expansion that is at least approximately equal to the coefficient of thermal expansion of the first substrate. The optical devices further include an optics element, such as a focus lens, dispersion lens, pin-hole lens, anti-reflective coating and/or a filter.

The assembly procedure 206 comprises assembling the optical devices with corresponding imaging units before cutting the imager workpiece and/or the optical device workpiece. The assembly procedure 206 can include assembling the optical devices with the imaging units before cutting either the first substrate or the second substrate, and then cutting both the first and second substrates to separate individual imagers from each other. In other embodiments, either the imager workpiece is cut to separate the imaging units from each other or the optical device workpiece is cut to separate the optical devices from each other before assembling the optical devices with corresponding imaging units.

Figure 2B:
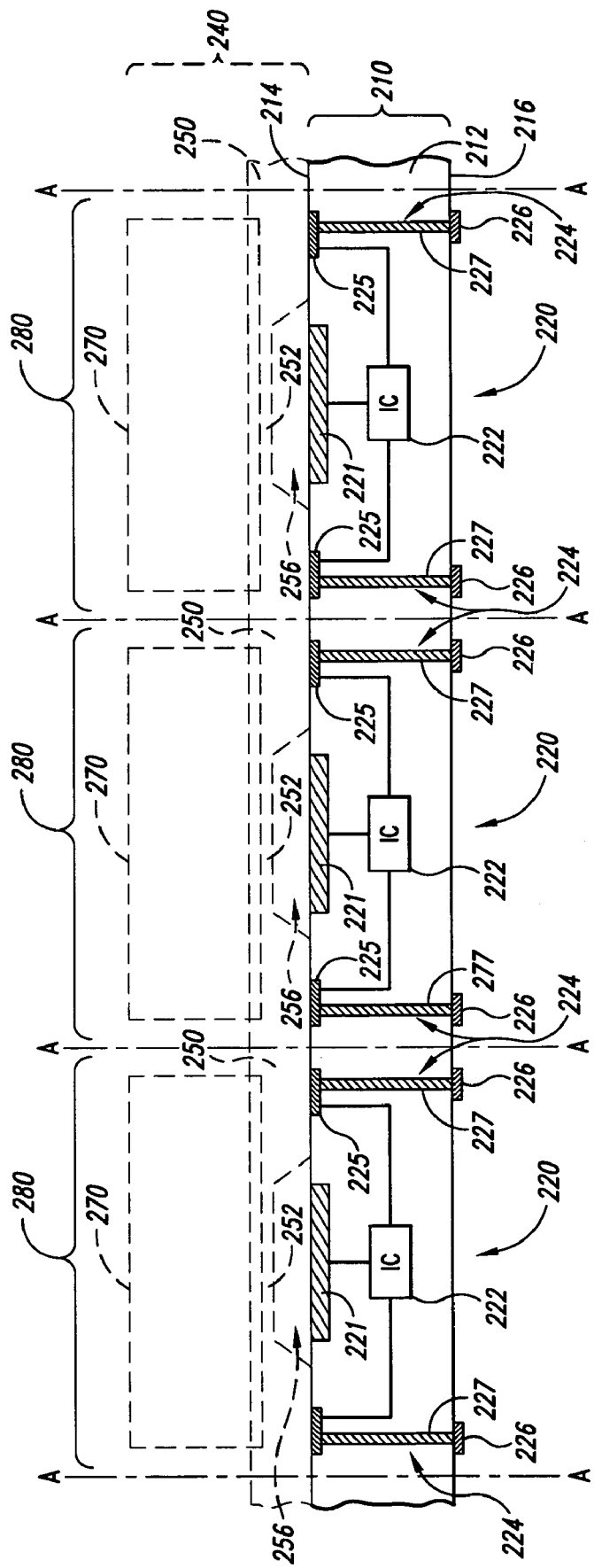
FIG. 2B is a cross-sectional view illustrating a plurality of microelectronic imagers packaged at the wafer level in accordance with an embodiment of the invention. Several features are schematically shown in FIG. 2B and explained in greater detail in FIGS. 3A-18.

FIG. 2B is a side cross-sectional view schematically illustrating an embodiment of an imager workpiece 210 formed in accordance with one embodiment of the imaging unit procedure 202. The imager workpiece 210 includes a first substrate 212 having a front side 214 and a backside 216. The imager workpiece 210 further includes a plurality of imaging dies 220 (i.e., imaging units) formed on and/or in the first substrate 212. Individual imaging dies 220 can include an image sensor 221, integrated circuitry (IC) 222 operatively coupled to the image sensor 221, and external contacts 224 electrically coupled to the integrated circuitry 222. The image sensors 221 can be CMOS devices or CCD image sensors for capturing pictures or other images in the visible spectrum, but the image sensors 221 can be sensors that detect radiation in other spectrums (e.g., IR or UV ranges). The embodiment of the external contacts 224 shown in FIG. 2 provides a small array of ball-pads within the footprint of the individual imaging dies 220. Each external contact 224, for example, can include a terminal 225 (e.g., ball-pad), a contact pad 226 (e.g., ball-pad), and a through-wafer interconnect 227 coupling the terminal 225 to the contact pad 226. The through-wafer interconnects 227 can be formed according to the processes disclosed in U.S. patent application Ser. No. 10/713,878 entitled "Microelectronic Devices, Methods for Forming Vias in Microelectronic Devices, and Methods for Packaging Microelectronic Devices," filed on Nov. 13, 2003, which is incorporated by reference herein in its entirety. Other embodiments of external contacts can include contacts having traces that wrap around the side of the first substrate 212 or front side contacts instead of the through-wafer interconnects 227.

FIG. 2B also schematically illustrates the optics procedure 204 and the assembly procedure 206. The aspects of the optics procedure 204 and the assembly procedure 206 shown in FIG. 2B are shown in broken lines as these are schematic representations that are described in more detail below with reference to FIGS. 3A-18. Referring back to FIG. 2B, the optics procedure 204 includes forming a plurality of optical devices on an optical device assembly 240 that is configured to be assembled with a plurality of the imaging dies 220 at the wafer level. The optical device assembly 240 can include stand-offs 250 and covers 252 that define compartments 256 in which the image sensors 221 are contained. The optical device assembly 240 can further include optics elements 270 attached to and/or formed integrally with the stand-offs 250 and/or the covers 252. As explained in more detail below, the optics elements 270 can be lenses and/or layers of materials that provide the desired optical characteristics for presenting the selected radiation to the image sensors 221.

The imaging workpiece 210 and the optical device assembly 240 illustrated in FIG. 2 can be assembled at the wafer level such that a plurality of imagers 280 are assembled before cutting the first substrate 212 to separate the individual image sensors 280 from each other. One aspect of wafer-level packaging is forming the optical devices using sophisticated micromachining processes to integrate the stand-offs 250, covers 252 and optics elements 270 in an integrated assembly. Additional aspects of wafer-level packaging include using automated handling equipment to install the optical devices such that the optics elements 270 are aligned with and spaced apart from the corresponding image sensors. FIGS. 3A-18 illustrate several embodiments of methods for (a) constructing the optical devices and (b) assembling the optical devices with the imaging units 220 for wafer-level packaging of microelectronic imagers.

C. Optical Devices and Procedures for Forming Optical Devices

Figure 3A:
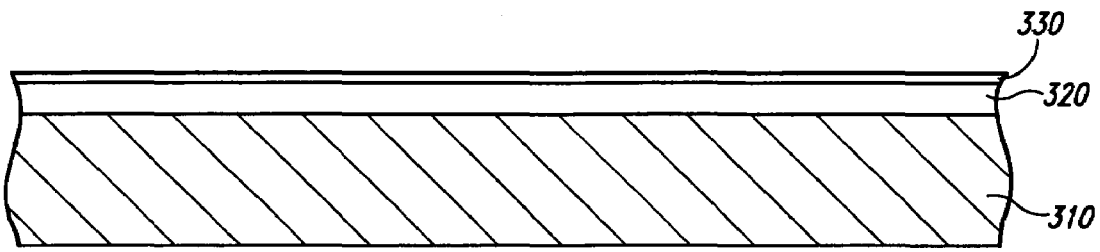
FIGS. 3A-3C are schematic side cross-sectional views illustrating stages of a method of forming components of optical devices in accordance with an embodiment of the invention.
Figure 3B:
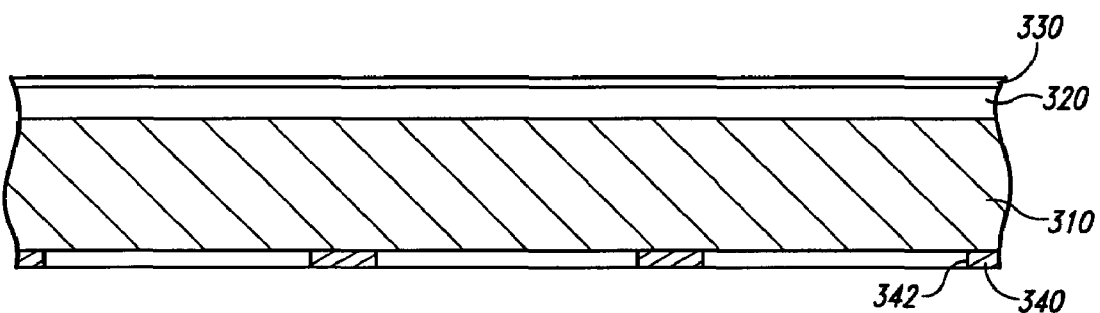
Figure 3C:
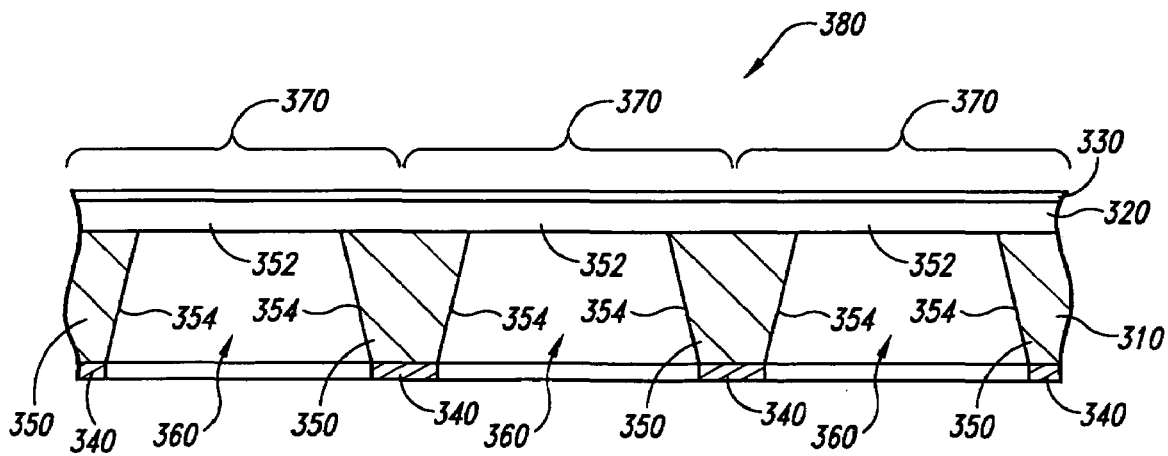

FIGS. 3A-3C illustrate an embodiment of a method for forming stand-offs and covers for use in wafer-level packaging of microelectronic imagers. FIG. 3A is a side cross-sectional view illustrating a second substrate 310 from which the stand-offs are formed and a cover stratum 320 from which the covers are formed. The second substrate 310 is composed of a material having a coefficient of thermal expansion that is at least substantially equal to the coefficient of thermal expansion of the first substrate 212 (FIG. 2B) upon which the image sensors 221 (FIG. 2B) and the integrated circuitry 222 (FIG. 2B) is formed. The second substrate 310, for example, can be a silicon wafer or another type of wafer composed of suitable III-V semiconductor materials. The second substrate 310 can accordingly include silicon germanium, silicon dioxide or gallium arsenide. In this embodiment, the cover stratum 320 is deposited onto the second substrate 310 using vapor deposition processes or other types of deposition processes, but it can alternatively be a separate component (i.e., thin plate) that is attached to the upper surface of the second substrate 310. The cover stratum 320 can be silicon dioxide (e.g., quartz), other types of glass, or other materials having the desired transmissivity for the particular radiation. The cover stratum 320 can accordingly be an IR filtering material. An optional coating 330 can be formed on the cover stratum 320 and/or the bottom surface of the second substrate 310 (not shown on FIG. 3A). The coating 330 can be a film or stack of films for filtering selected spectrums of radiation (e.g., IR or UV) and/or providing anti-reflective properties. The coating 330 can be applied using vapor deposition or sputtering processes known in the art.

Referring to FIG. 3B, a mask 340 is formed on the exposed side of the second substrate 310. The mask includes a plurality of openings 342 through which the second substrate 310 can be etched. As shown in FIG. 3C, a plurality of stand-offs 350 are formed from the second substrate 310 and a plurality of covers 352 are defined by regions of the cover stratum 320. The stand-offs 350 include sidewalls 354 that define compartments 360 configured to contain the image sensors 221 (FIG. 2B). The second substrate 310 can be etched using an isotropic etch or an anistropic etch depending on the particular applications to form the stand-offs 350 and expose the covers 352. After the second substrate 310 has been etched, the mask 340 can be stripped from the second substrate 310.

The embodiment of the method shown in FIGS. 3A-3C forms a plurality of optical devices 370 integrated in an optical device assembly 380. The optical devices 370 can be mounted to the imager workpiece 210 (FIG. 2B) for wafer-level packaging of the image sensors. The optical devices 370 are attached to the first substrate 212 (FIG. 2B) by stripping the mask 340 from the second substrate 310 and aligning the covers 352 with corresponding image sensors 221 (FIG. 2B). The stand-offs 350 can be attached to the second substrate 212 using an adhesive and/or a weld. The image sensors 221 are accordingly contained within corresponding compartments 360. Additional features, such as focus lenses, dispersion lenses and/or pin-hole lenses, can be added to the top and/or bottom surfaces of the covers 352 either before or after attaching the stand-offs 350 to the first substrate 212.

The illustrated embodiments of the optical devices 370 provide several advantages compared to conventional optical devices in microelectronic imagers. For example, the stand-offs 350 and the covers 352 are formed as an integral unit using precise micromachining processes. This allows the stand-offs 350 to have precise dimensions for accurately aligning the optics elements with corresponding image sensors using automated equipment. As such, the optical device assembly 380 is particularly well suited for wafer-level packaging of microelectronic imagers using automated equipment to avoid the time-consuming and labor intensive methodology that is currently used to manually assemble optical devices with imaging dies. The optical device assembly 380 shown in FIG. 3C is accordingly expected to significantly enhance the throughput and the accuracy of packaging microelectronic imagers.

Another advantage of the illustrated embodiment of the optical device assembly 380 is that the optical devices 370 are less likely to leak or outgas contaminants into the compartments 360 after being assembled with the imaging dies 220 (FIG. 2B). First, the sidewalls 354 are formed integrally so that there are no seams between adjacent walls, and the covers 352 are deposited on or otherwise attached to the stand-offs 350 in a manner that provides an integral five-sided protection for the compartments 360. This limits the areas where leaks can occur to the interface between the stand-offs 350 and the first substrate 212 (FIG. 2B). This is much better than the conventional device 1 shown in FIG. 1 because the convention imager 1 is subject to leaking between the interposer 20 and the housing 30, the cover 40 and the housing 30, the support 50 and the housing 30, and the barrel 60 and the support 50. Second, the optical devices 370 are fabricated from silicon, glass or other suitable ceramic materials that do not outgas into the compartments 360. This is a significant improvement over the organic materials of the housing 30 and the interposer 20 that outgas contaminants and moisture. Therefore, the optical devices 370 are further expected to significantly mitigate contamination of the image sensors that can be caused by leaks or outgassing.

Still another advantage of the illustrated embodiments of the optical devices 370 is that they are dimensionally stable over a large temperature range to (a) provide consistent optical properties and (b) further mitigate leaking. The optical devices 370 and the imaging dies 220 (FIG. 2B) provide a dimensionally stable package because the stand-offs 350 are formed from a material having a coefficient of thermal expansion that is at least substantially the same as that of the second substrate 212 (FIG. 2B). More specifically, the second substrate 310 from which the stand-offs 350 are formed is typically silicon, glass, or a ceramic that expands and contracts approximately the same amount as the first substrate 212 to mitigate inducing stress at the interface between the stand-offs 350 and the first substrate 212. This is expected to be a significant improvement over stand-offs formed using polymers or other similar materials that have a coefficient of thermal expansion that is substantially different than that of the first substrate 212. The optical devices 370 with the stand-offs 350 are accordingly expected to significantly reduce the occurrence of leaks that are caused by temperature induced stresses between the stand-offs 350 and the first substrate 212. Moreover, the dimensional changes of the optical devices 370 caused by different temperatures is much less than that of polymers such that the optical devices 370 provide a more consistent focal distance and alignment with the image sensors 221 (FIG. 2B) for better optical performance.

1. Top Side Optics Elements

Figure 4A:
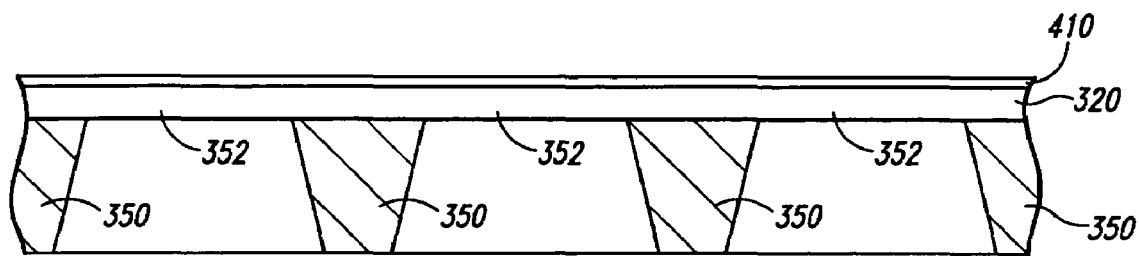
FIGS. 4A and 4B are schematic cross-sectional views illustrating stages of the method of constructing optical devices in accordance with an embodiment of the invention.
Figure 4B:
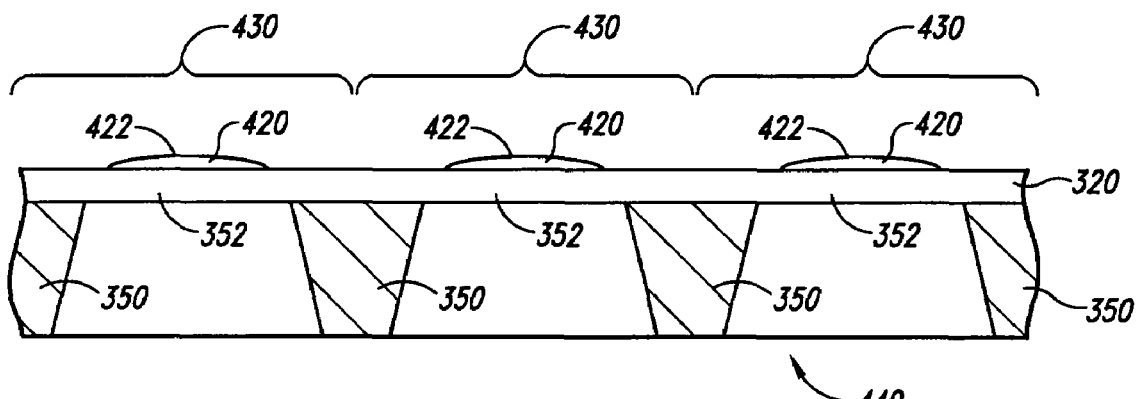

FIGS. 4A and 4B illustrate a method for forming optical devices 430 (FIG. 4B) in accordance with another embodiment of the invention. Referring to FIG. 4A, the stand-offs 350 and covers 352 are formed as described above with reference to FIGS. 3A-3C. FIG. 4A further illustrates forming topside lenses by depositing or otherwise attaching an optics material layer 410 to the cover stratum 320. The optics material layer 410 can be composed of glass, polymeric materials or other materials that are suitable for forming lenses or other optical members on the cover stratum 320. Referring to FIG. 4B, optics elements 420 are formed on the covers 352 by patterning and etching the optics material layer 410 (FIG. 4A) with suitable mask/etch procedures. The optics elements 420 typically include a curved surface 422 for focusing and/or dispersing the radiation as it passes through the optics elements 420. The curved surface 422 is shown schematically in FIG. 4B; in practice the optics elements 420 can have compound curved surfaces with convex and/or concave curvatures relative to the cover stratum 320. Additionally, the radius of curvature for the various compound curves can vary across the curved surface 422 to provide the desired optical properties.

The individual optical devices 430 are defined by the stand-offs 350, covers 352 and optics elements 420. The optical devices 430 in the embodiment shown in FIG. 4B are arranged in an optical device assembly 440 that can be attached directly to the first substrate 212 (FIG. 2B) for packaging a plurality of microelectronic imagers at the wafer level as described above.

Figure 5:
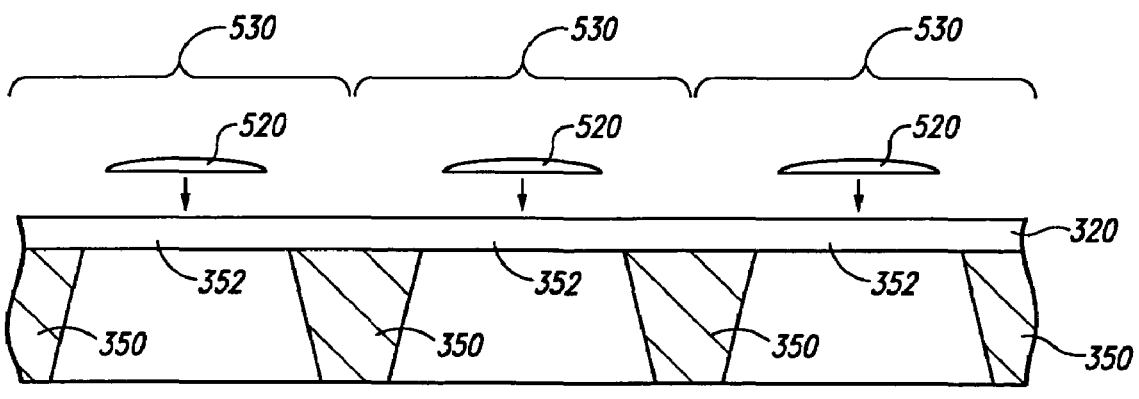
FIG. 5 is a schematic cross-sectional view illustrating a method of constructing optical devices in accordance with the invention.

FIG. 5 is a side cross-sectional view schematically illustrating a method for fabricating optical devices 530 in accordance with another embodiment of the invention. In this embodiment, a plurality of optics elements 520 are constructed separately from the stand-offs 350 and the cover stratum 320. The optical elements 520 are then attached to the upper surface of the cover stratum 320 at corresponding covers 352 to form the optical devices 530. The optics elements 520 can be attached using an adhesive or polymer with suitable optical properties, and the adhesive can cover the bottom of the optics elements 520 or be placed around the edges of the optics elements 520. The optical devices 530 can be arranged in an optical device assembly 540 for wafer-level packaging microelectronic imagers as described above.

Figure 6A:
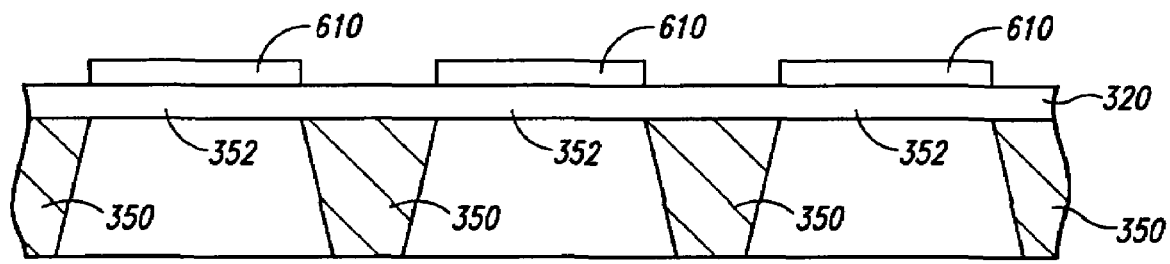
FIGS. 6A and 6B are schematic side cross-sectional views illustrating stages of a method of constructing optical devices in accordance with an embodiment of the invention.
Figure 6B:
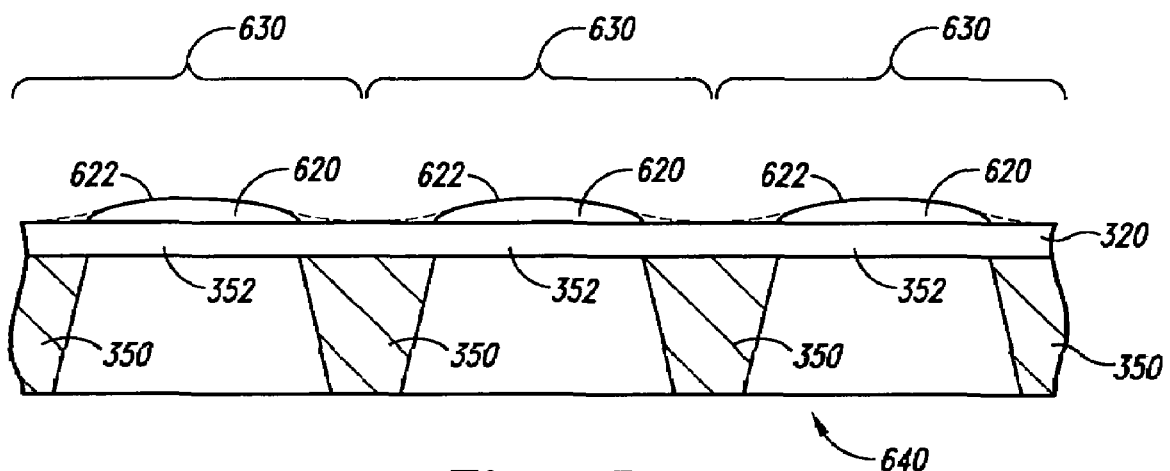

FIGS. 6A and 6B illustrate another method for forming optical devices 630 (FIG. 6B) in accordance with another embodiment of the invention. Referring to FIG. 6A, a plurality of blocks 610 are deposited or otherwise attached to the cover stratum 320 over the covers 352. The blocks 610 are composed of a suitable optical material that changes shape when exposed to heat, radiation (e.g., UV, RF, etc.), ultrasonic or other sources of energy during a curing cycle. Referring to FIG. 6B, a plurality of individual optics elements 620 having curved surfaces 622 are formed by curing the blocks 610 (FIG. 6A) to fabricate the optical devices 630. The optical devices 630 are arranged in an optical device assembly 640 that can be attached to the first substrate 212 (FIG. 2B) to assemble the optical devices 630 with corresponding imaging dies 220 (FIG. 2B) at the wafer level.

The optics element 620 can have several configurations. As shown by a dotted line in FIG. 6B, for example, the optics elements 620 can be very close to each other to form an continuous or at least nearly continuous layer on the cover stratum 320. Additionally, the optics elements 620 can be covered with an optional hard shell that follows the contour of the optics elements similar to the dotted line. Suitable hard shells are typically composed of low temperature materials, such as low temperature $SiO_2$, that are deposited using vapor deposition process, spin-on techniques or other processes.

2. Bottom Side Optics Elements

Figure 7A:
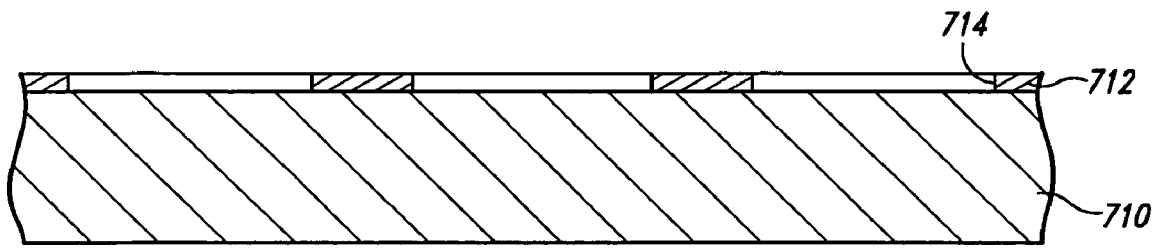
FIGS. 7A-7F are schematic side cross-sectional views illustrating stages of a method for constructing optical devices in accordance with an embodiment of the invention.

FIGS. 7A-7F illustrate stages of a method for forming optical devices 770 (FIG. 7F) in accordance with another embodiment of the invention. Referring to FIG. 7A, the process begins by providing a second substrate 710 having a coefficient of thermal expansion at least substantially equal to that of the first substrate 212 (FIG. 2B). The second substrate 710, for example, can be a silicon wafer or other material described above. The method continues by forming a mask 712 on the second substrate 710. The mask 712 includes a plurality of openings 714 arranged in a pattern for forming optics elements.

Figure 7B:
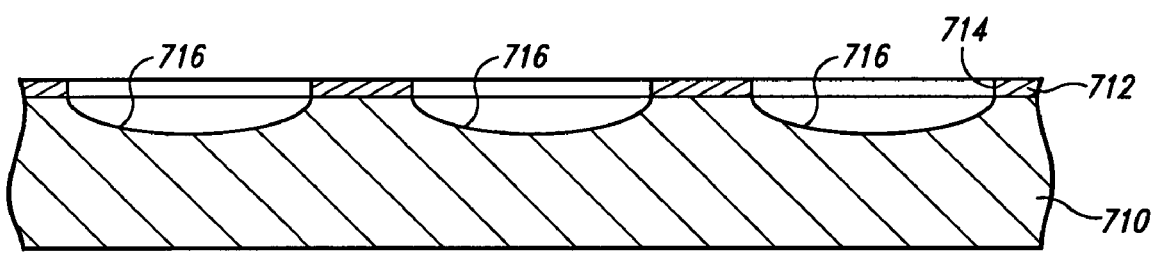
Figure 7C:
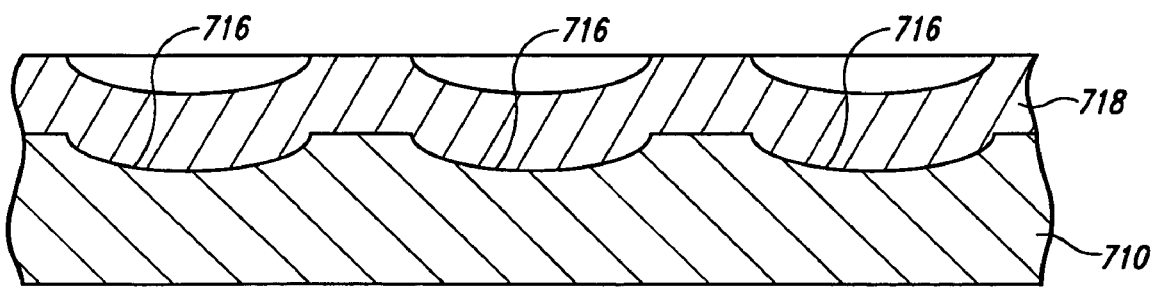
Figure 7D:
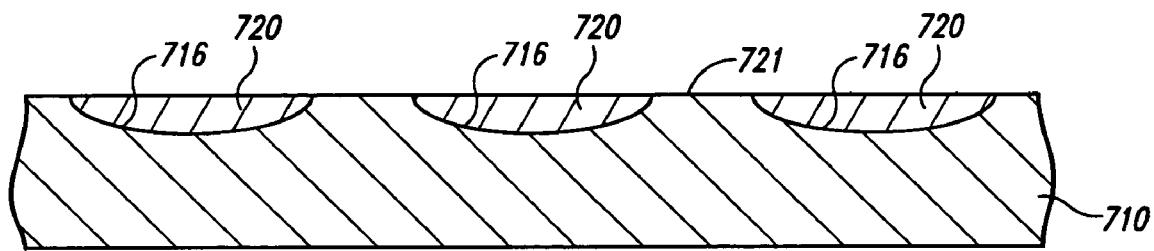

FIGS. 7B-7D illustrate subsequent stages for forming a plurality of stand-offs with individual optics elements. Referring to FIG. 7B, a plurality of depressions 716 are etched into the second substrate 710 through the openings 714 of the mask 712. The depressions 716 can be etched isotropically to have a desired surface curvature for the optics elements, and several mask/etch procedures may be required to form the desired curvature in the depressions. Referring to FIG. 7C, the mask 712 is stripped off and an optics material layer 718 is deposited onto the second substrate 710. The optics material layer 718 can be deposited using vapor deposition processes, sputtering, spin-on techniques, stenciling or other suitable procedures. The optics material layer 718 is composed of glass, silicon dioxide, polymeric materials or other materials that are suitable for the optics elements. As shown in FIG. 7D, an upper portion of the optics material layer 718 is then removed to form a plurality of optics elements 720 in the depressions 716 of the second substrate 710. Although FIG. 7D shows an embodiment in which the optics material layer 718 remains only in the depressions, it will be appreciated that a portion of the optics material layer 718 can remain on the substrate 710 between the depressions 716. The upper portion of the optics material layer 718 can be removed using chemical-mechanical planarization procedures to endpoint the procedure at a final surface 721. As known in the art of semiconductor fabrication, the final surface 721 and the individual optics elements 720 can be formed with a high degree of accuracy and planarity using chemical-mechanical planarization processes.

Figure 7E:
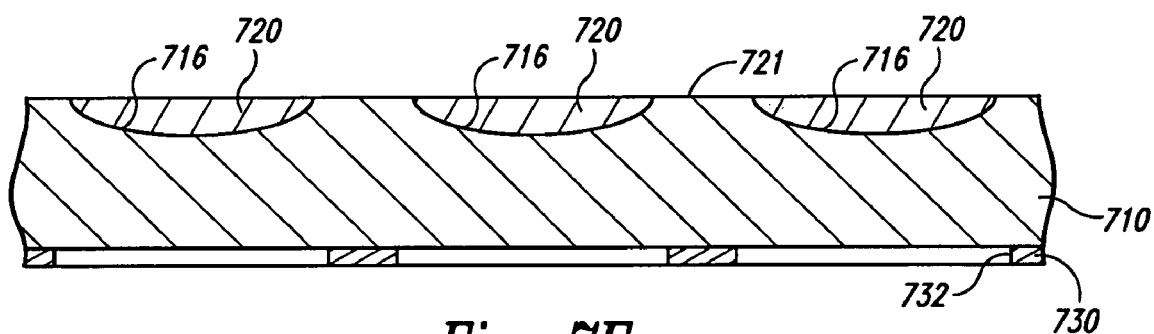
Figure 7F:
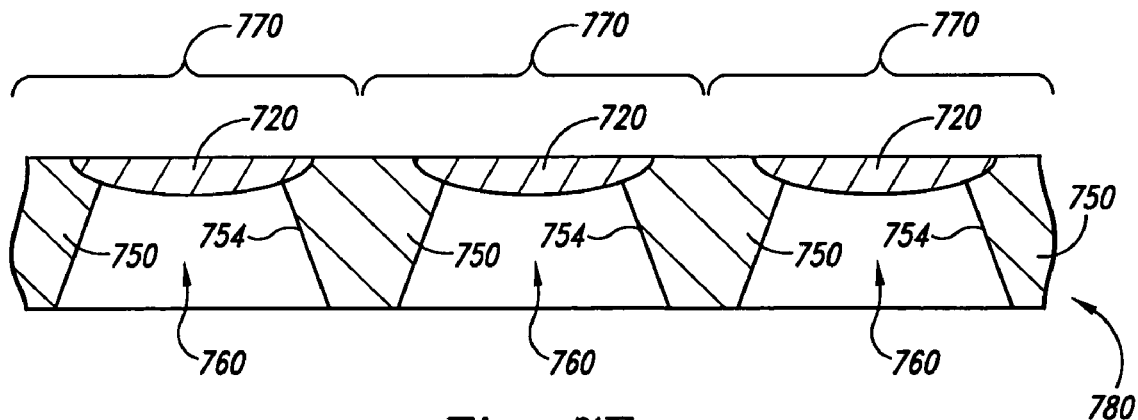

FIGS. 7E and 7F illustrate subsequent stages for forming the optical devices 770 (FIG. 7F) arranged in an optical device assembly 780 (FIG. 7F). Referring to FIG. 7E, a mask 730 having opening 732 is formed on an opposite surface of the second substrate 710. Referring to FIG. 7F, the substrate 710 is then etched to form a plurality of stand-offs 750 having sidewalls 754 defining compartments 760 aligned with corresponding optics elements 720. The optics elements 720 are integral with the stand-offs 750 in the illustrated embodiment of the optical devices 770. Additionally, the optics elements 720 also define individual covers for enclosing corresponding image censors within the compartments 760.

Figure 8A:
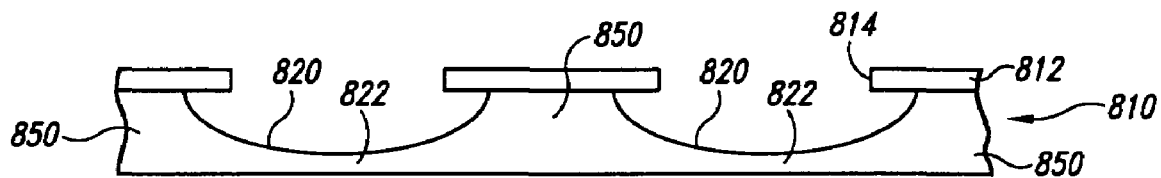
FIGS. 8A and 8B are schematic side cross-sectional views illustrating stages of a method for installing optical devices in accordance with another embodiment of the invention.
Figure 8B:
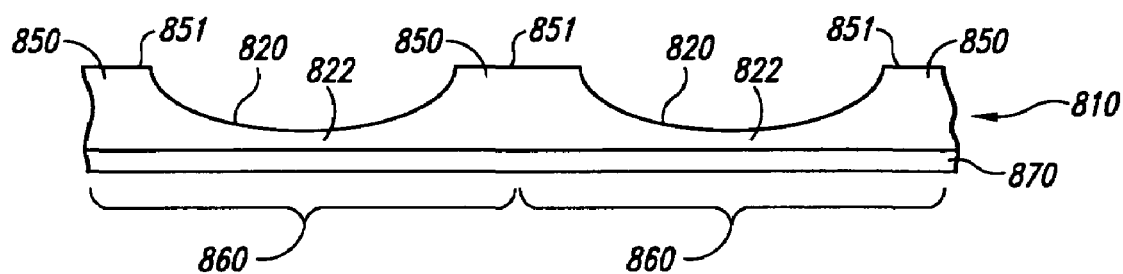

FIGS. 8A and 8B illustrate stages of a method for forming lenses directly in the same material as the stand-offs in accordance with another embodiment of the invention. The lenses shown in FIGS. 8A and 8B are illustrated upside down for processing, but they are typically inverted for installation. Referring to FIG. 8A, a second substrate 810 is etched through a plurality of openings 814 of a mask layer 812 to form a plurality of cavity lenses 820 and stand-offs 850. The etching process can be an isotropic etch to form a curved surface that provides the desired optical characteristics to the optics elements 820. In this embodiment, the optics elements 820 include a thin apex portion 822 that is sufficiently transmissive to the desired radiation. FIG. 8B illustrates a subsequent stage of this method in which a plurality of optical devices 860 are produced after the mask 812 is stripped from the first substrate 810. The optical devices 860 can further include an optional cover stratum 870 that is deposited on or otherwise attached to the second substrate 810. The cover stratum 870 can be composed of quartz or another suitable material for filtering certain spectrums of radiation. After forming the optics elements 820, the optical devices 860 are inverted so that footings 851 of the optics supports 850 can be attached to the first substrate 212 (FIG. 2B).

Figure 9:
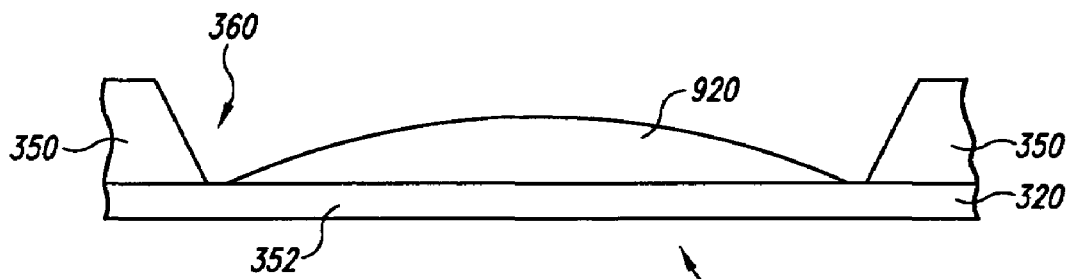
FIG. 9 is a schematic side cross-sectional view illustrating another embodiment of constructing optical devices in accordance with an embodiment of the invention.

FIG. 9 is a side cross-sectional view illustrating an optical device 910 formed in accordance with another embodiment of the invention. The optical device 910 is illustrated in an upside down orientation, but it will be appreciated that the optical device 910 is attached to the first substrate 212 (FIG. 2B) right side up. Additionally, only a single optical device 910 is shown in FIG. 9, but a plurality of such optical devices can be constructed in accordance with this embodiment of the invention. The optical device 910 includes the cover stratum 320, the stand-offs 350, a cover 352 and a cavity 360. The optical device 910 further includes an optics element 920 attached to the backside of the cover stratum 320 within the cavity 360. The optical element 920 can be formed by depositing a layer of material on the backside of the cover stratum 320 and then etching the material to form the optics element 920 in a manner similar to that described above with reference to FIGS. 4A-4B. In another embodiment, the optic element 920 can be formed by depositing a block of material onto the backside of the cover stratum 320 and then curing it to form the optics element 920 in a manner similar to that described above with reference to FIGS. 6A-6B.

Figure 10:
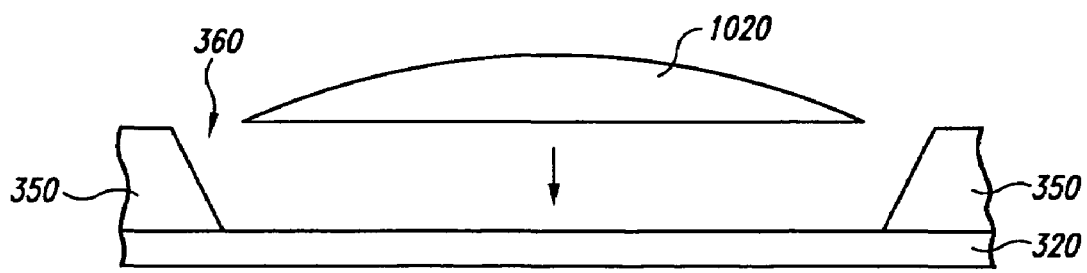
FIG. 10 is a schematic side cross-sectional view illustrating another embodiment of constructing optical devices in accordance with an embodiment of the invention.

FIG. 10 is a side cross-sectional view illustrating a method for forming an optical device 1010 in accordance with another embodiment of the invention. In this embodiment, an optics element 1020 is formed separate from the cover stratum 320 and then attached to the backside of the cover stratum 320 in the compartment 360. The optics elements 1020 can be substantially similar to those described above with reference to FIG. 5.

Figure 11A:
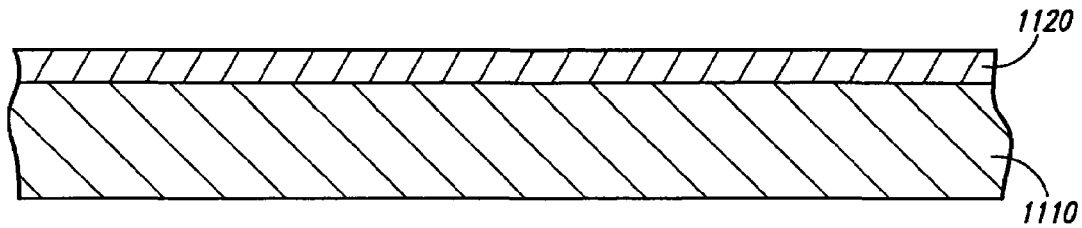
FIGS. 11A-11D illustrate stages of a method for constructing optical devices in accordance with an embodiment of the invention.
Figure 11B:
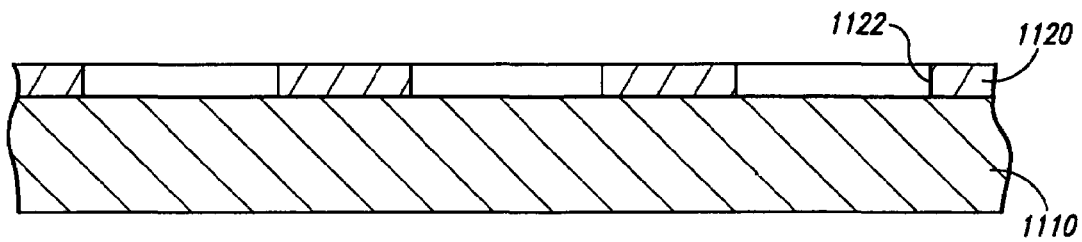
Figure 11C:
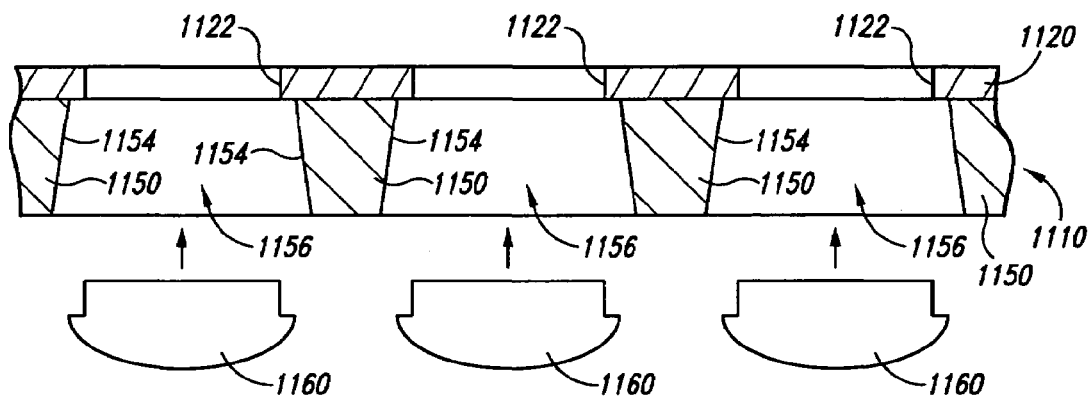

FIGS. 11A-11D illustrate an embodiment of forming a plurality of optical devices 1170 (FIG. 11D) in accordance with another embodiment of the invention. Referring to FIG. 11A, this method includes providing a second substrate 1110 and a cover stratum 1120 on the second substrate 1110. The second substrate 1110 can be composed of silicon or another material having a coefficient of thermal expansion that is at least substantially equal to that of the first substrate containing the image sensors as described above. The stratum 1120 can be glass, quartz, silicon nitride, or another type of material deposited on or otherwise attached to the first substrate 1110. The stratum 1120 is patterned and etched to form a plurality of openings 1122 that are exposed to the upper surface of the first substrate 1110 (FIG. 11B). The openings 1122 can alternatively be mechanically machined into the stratum 1122. Referring to FIG. 11C, the first substrate 1110 is then patterned and etched to form a plurality of stand-offs 1150 that have sidewalls 1154 defining compartments 1156. The stand-offs 1150 can be etched into the first substrate 1110 as described above with reference to FIGS. 3A-3C.

Figure 11D:
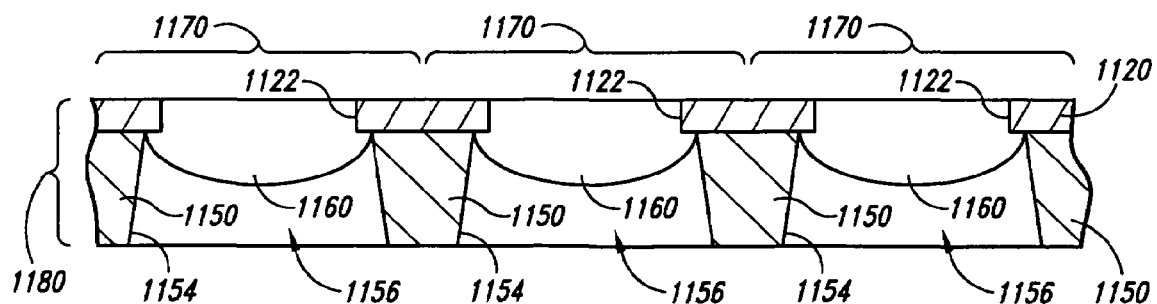

The method further includes installing a plurality of optics elements 1160 in the openings 1122. Referring to FIG. 11D, the optics elements 1160 are typically adhered or welded to the stratum 1120 to form an optical device assembly 1180 having a plurality of optical devices 1170. The optics elements 1160 are formed separately from the stratum 1120 and the stand-offs 1150. For example, the optics elements 1160 can be molded and/or etched as separate, discrete components. The optics elements 1160 are generally dispersion lenses, focus lenses and/or pin-hole lenses. As such, the optics elements 1160 can have one or more concave and/or convex surfaces. The optics elements 1160 can also have anti-reflective films and/or filters coating the upper and/or the lower surfaces.

Figure 12:
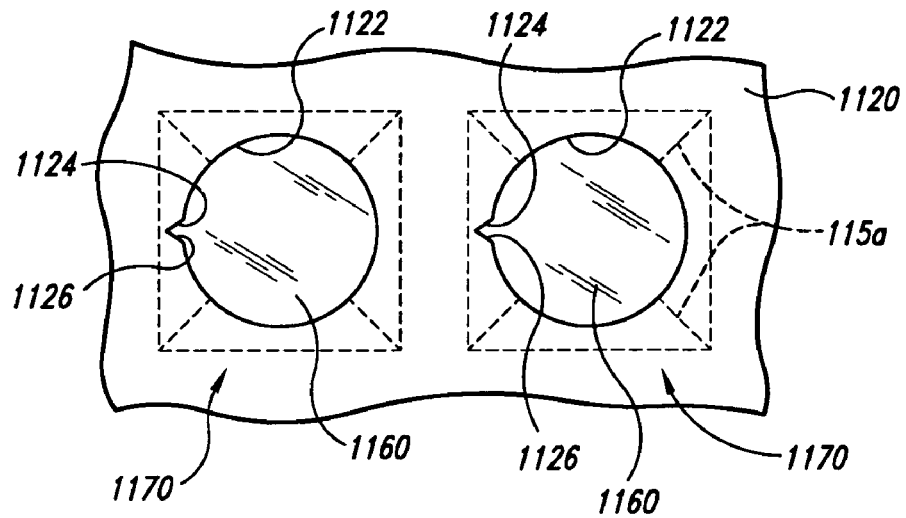
FIG. 12 is a top plan view of a plurality of optical devices constructed in accordance with an embodiment of the invention.

FIG. 12 is a top plan view illustrating one embodiment of the optical devices 1170 constructed as shown in FIGS. 11A-11D. The openings 1122 can include reference elements 1124, such as notches or tabs, that interface with a corresponding reference element 1126 of an optics element 1160. The reference elements 1124 and 1126 insure that the optics elements are properly positioned in the openings 1122 with the correct rotational orientation. The optics elements 1160 can accordingly have asymmetric configurations that require the optics elements 1160 to have the correct rotational orientation within the openings 1122.

3. Stacked Optical Devices

Figure 13A:
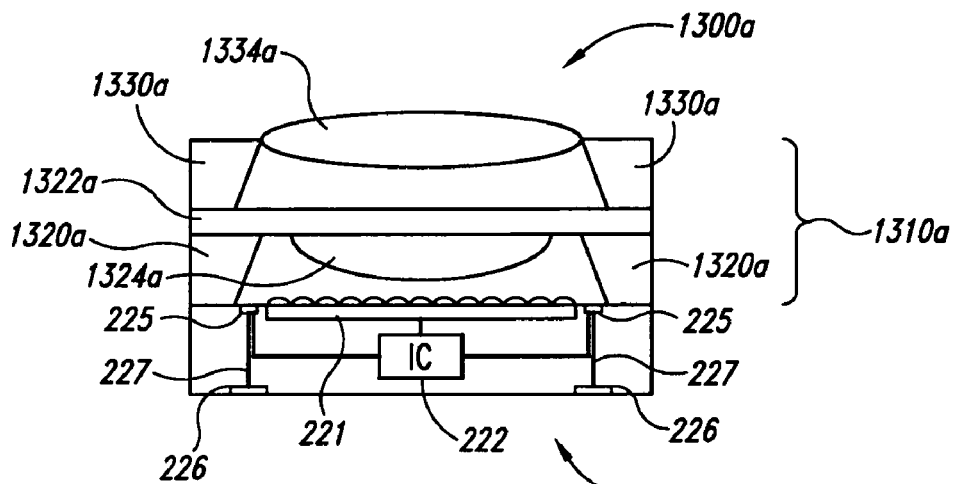
FIGS. 13A and 13B are schematic cross-sectional views illustrating additional embodiments of optical devices constructed in accordance with the invention.
Figure 13B:
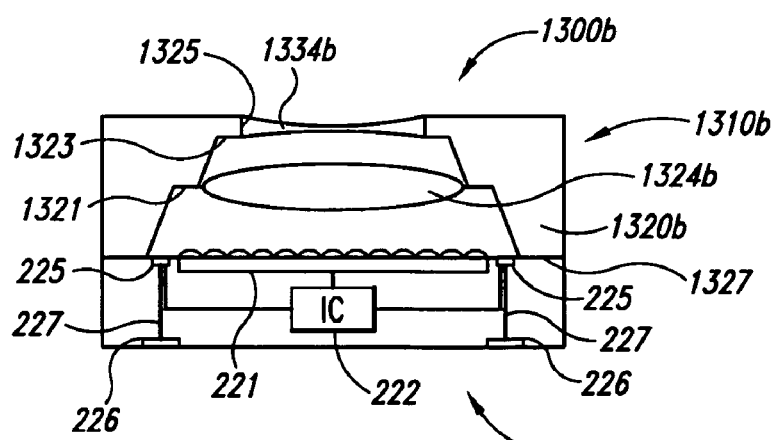

FIGS. 13A and 13B illustrate additional embodiments of microelectronic imagers in accordance with the invention. FIG. 13A is a side cross-sectional view illustrating an embodiment of an imager 1300a having the imaging die 220 and an optical device 1310a attached to the imaging die 220. The optical device 1310a is a stacked unit including a first stand-off 1320a and a second stand-off 1330a. The first stand-off 1320a carries a cover 1322a and a first optics element 1324a, and the second stand-off 1330a carries a second optics element 1334a. The first stand-off 1320a and the first optics element 1324a can be constructed in accordance with any of the embodiments illustrated in FIGS. 3A-6B, FIG. 9 and/or FIG. 10. The second stand-off 1330a and the second optics element 1334a can be constructed in accordance with any of the methods described above with reference to FIGS. 7A-7F and FIGS. 11A-11D. The optical device 1310a can be formed at the wafer level by stacking the first and second stand-offs 1320a and 1330a before cutting the substrates from which the stand-offs were made. The stacked optical devices can then be attached to the first substrate 212 (FIG. 2B) at the wafer level. Alternatively, individual optical devices 1310a can be singulated from each other and then attached individually to the first substrate 212 in a different embodiment of wafer-level packaging.

FIG. 13B illustrates an imager 1300b including the imaging die 220 and an optical device 1310b attached to the imaging die 220. The optical device 1310b includes a stand-off 1320b having a first lens site 1321 and a second lens site 1323. The lens sites 1321 and 1323 are formed by etching a wafer using a series of patterns and etches in a selected sequence. In general, the etches remove material starting from the backside 1327 of a wafer by forming sidewalls for the more centrally located steps first. More specifically, a step configured to become an opening 1325 is initially etched in the backside 1327 of the wafer, the sidewall projecting downwardly from the second lens site 1323 to the first lens site 1321 is then etched, and then the sidewall from the first lens site 1321 to the backside 1327 is etched. The etches generally occur with the wafer inverted from the orientation shown in FIG. 13B such that the opening 1325 is completed upon the final etch for forming the sidewall from the first lens site 1321 to the backside 1327.

The optical device 1310b further includes a first optics member 1324b attached to the first lens site 1321 and a second optics member 1334b attached to the second lens site 1323. The optical devices 1310b can be formed at the wafer level such that a plurality of optical devices 1310b are formed simultaneously. The optical devices 1310b can also be attached to the first substrate 212 (FIG. 2B) for packaging a plurality of the imagers 1300b at the wafer level. The embodiment of the imager 1300b shown in FIG. 13B has two lens sites with two optics elements, but other stacked embodiments can have more than two lens sites and optics elements.

4. Grid Type Stand-Offs

FIG. 14 illustrates an imager assembly 1400 having a plurality of imagers 1402 in accordance with another embodiment of the invention. The imager assembly 1400 can include an imager workpiece having a first substrate 1410 upon which a plurality of imaging dies 1420 are fabricated. The imaging dies 1420 can have the image sensor 221, the integrated circuitry 222, and the external contacts 224 as described above with respect to FIG. 2B. The imager assembly 1400 further includes a plurality of optical devices 1430 formed on a second substrate 1431. The optical devices 1430 typically include a cover area 1432 defined by a portion of the second substrate 1431 and an optics element 1434 attached to or otherwise formed on the second substrate 1431 at the cover area 1432. The optical devices 1430 can further include a plurality of stand-offs 1450. The stand-offs 1450 can be uprights formed from the substrate 1410 itself or another layer material that is deposited onto the first substrate 1410. The stand-offs 1450, for example, can be formed by etching the substrate 1410. The stand-offs 1450 include sidewalls 1452 that project upwardly relative to the image sensors 221. The sidewalls 1452 and the second substrate 1431 define a plurality of compartments 1460 in which individual image sensors 221 are contained.

The imager dies 1420 from FIG. 14 can be constructed by etching the first substrate 1410 to form the stand-offs 1450 before constructing the image sensors. The image sensors 221, integrated circuitry 222 and external contacts 224 can then be fabricated on the first substrate 1410 after etching the compartments. The second substrate 1431 is subsequently attached to the stand-offs 1450 to enclose the image sensors 221 in corresponding compartments 1460. In alternate embodiments, the second substrate 1431 can be cut before attaching the optical devices 1430 to the stand-offs 1450 so that the optical devices can be attached to known good imaging dies 1420.

FIG. 15 is a side cross-sectional view illustrating an imager assembly 1500 having a plurality of microelectronic imagers 1502 packaged at the wafer level. In this embodiment, the imager assembly 1500 includes the imager workpiece 210 having the plurality of imaging dies 220 as described above with reference to FIG. 2B. The imager assembly 1500 further includes a plurality of optical devices 1510 having a second substrate 1520 with a plurality of individual cover sections 1522 and optics elements 1524 attached to the second substrate 1520 at the cover sections 1522. The optical devices 1510 can further include a plurality of stand-offs 1550 that are attached to the first substrate 212 and the second substrate 1520. The stand-offs 1550 include sidewalls 1552 that define compartments 1560 in which the image sensors 221 are contained.

Figure 16A:
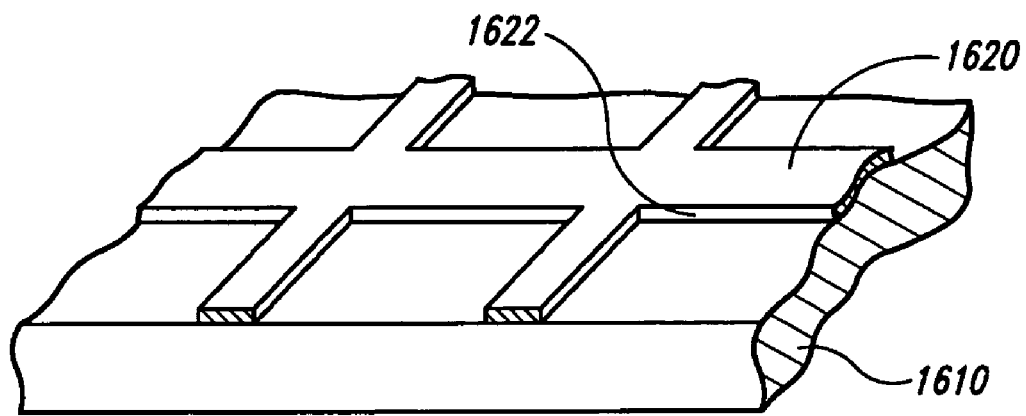
FIGS. 16A and 16B are isometric views illustrating stages of a method for constructing stand-offs for optical devices used in wafer-level packaging of microelectronic imagers in accordance with an embodiment of the invention.
Figure 16B:
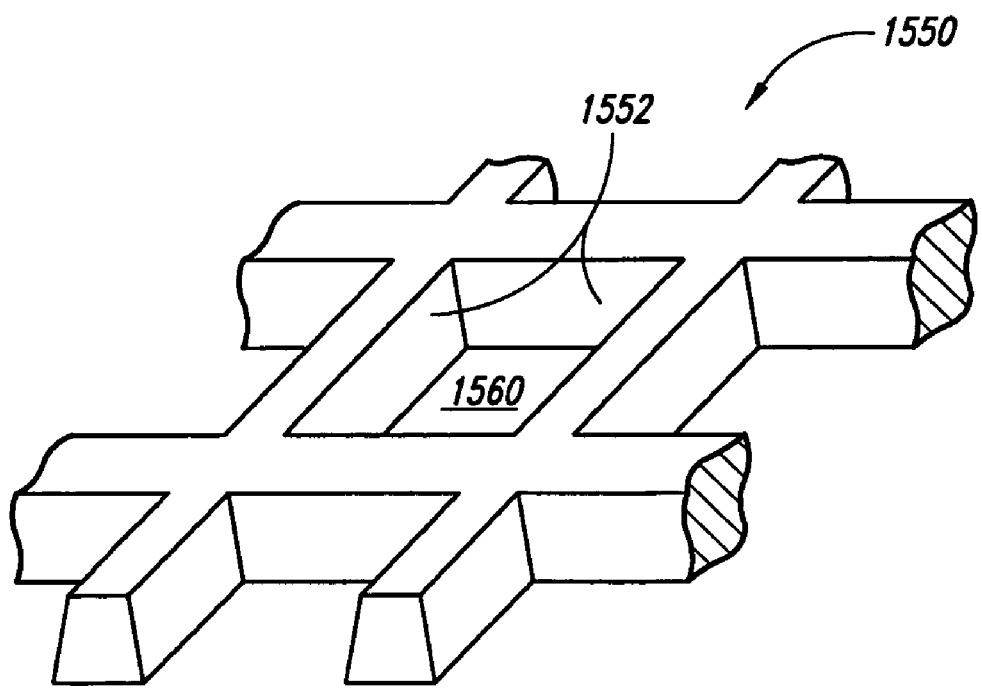

The stand-offs 1550 are formed separately from both the first substrate 212 and the second substrate 1520. For example, the stand-offs 1550 can be etched from a wafer to form a grid having openings arranged to be aligned with both the image sensors 212 and corresponding optics elements 1524. FIGS. 16A and 16B are isometric views illustrating one embodiment of forming the stand-offs 1550 shown in FIG. 15. Referring to FIG. 16A, a wafer 1610 is covered with a mask 1620 having a plurality of openings 1622. The wafer 1610 can be composed of silicon or another material having a coefficient of thermal expansion that is at least substantially the same as that of the first substrate 212 (FIG. 15). The method further includes etching the wafer 1610 through the openings 1622 using a suitable isotropic or anistropic etch. FIG. 16B illustrates the stand-offs 1550 after etching the wafer 1610 (FIG. 16A). The stand-offs 1550 accordingly include the sidewalls 1552 that define compartments 1560 in which individual image sensors are contained.

D. Wafer-Level Assembly

FIGS. 17 and 18 are cross-sectional views that schematically illustrate processes of assembling optical device assemblies with imaging unit workpieces to package image sensors at the wafer level. Referring to FIG. 17, the imager workpiece 210 having the first substrate 212 and a plurality of the image sensors 221 is assembled with an optical device assembly 1710. In this embodiment, the optical device assembly 1710 includes the optical devices 430 described above with reference to FIG. 4B. Accordingly, the optical device assembly 1710 includes the stand-offs 350, the cover stratum 320, and the optics elements 420 on the top side of the cover stratum 320. In one embodiment, the optical device assembly 1710 is assembled with the imager workpiece 210 before cutting through the first substrate 212. Individual image sensors 1720 are then singulated from each other by cutting the imager workpiece 210 and the optical device assembly 1710 along lines A-A. In another embodiment, the optical device assembly 1710 is singulated before attaching individual optical devices to corresponding imaging units. In still another embodiment, the first substrate 212 is singulated and the individual imaging dies are attached to the stand-offs 350 of corresponding optical devices. In either of these latter two embodiments, only known-good-dies are attached to corresponding optical devices because the imaging dies and the optical devices are formed separately from each other and connected together at the end of the process. The total yield is accordingly independent of the individual yield of either the imager dies or the optical devices.

FIG. 18 illustrates another embodiment in which an imaging workpiece 1810 is assembled with an optical device assembly 1812 to package a plurality of imagers 1820. In this embodiment, the imager workpiece 1810 includes the image sensor 221 and the integrated circuitry (not shown). The optical device assembly 1812 includes the stand-offs 350 and optics elements 920 illustrated in FIG. 9. The optical device assembly 1812 further includes external contacts 1830 having a terminal 1832, external contact pads 1834 (e.g., balls), and interconnects 1836. In this embodiment, the interconnects 1836 extend through the stand-offs 350 and the cover stratum 320 to electrically connect the image sensors 221 with the external contact pads 1834.

In operation, the imager workpiece 1810 and the optical device assembly 1812 can be assembled before cutting either the imager workpiece 1810 or the optical device assembly 1812. As explained above with reference to FIG. 17, one or both of the imager workpiece 1810 or the optical device assembly 1812 can be singulated to attach only known-good-dies to good optical devices.

From the foregoing, it will be appreciated that specific embodiments of the invention have been described herein for purposes of illustration, but that various modifications may be made without deviating from the spirit and scope of the invention. For example, many features of the various embodiments can be combined with each other in additional embodiments. Several such embodiments could have any of the top side optics elements combined with any of the bottom side optics elements shown in FIGS. 4A-12. Additionally, the stand-offs can be composed of different materials than the specific materials disclosed above, and the compartments can have different configurations (e.g., circular, oval, elliptical, etc.) Accordingly, the invention is not limited except as by the appended claims.

I claim:

1. An optical device for use with microelectronic imaging dies having a first substrate composed of a semiconductor material, an imager sensor on the first substrate, and an integrated circuitry electrically coupled to the image sensor, the optical device comprising:

a stand-off having a sidewall and a compartment defined by the sidewall, the stand-off being composed of a material having a coefficient of thermal expansion at least approximately the same as that of the semiconductor material of the first substrate; and an optics element, the optics element being formed in a plurality of depressions in said stand-off material, and being integral with the stand-off such that there is no layer between the optics element and the stand-off and the optics element are positioned in alignment with the compartment.

2. The optical device of claim 1, wherein the stand-off is composed of silicon, glass, quartz and/or a III-V silicon material.

3. The optical device of claim 1, further comprising: a plurality of stand-offs; and a plurality of optics elements, wherein:

the stand-offs comprise a second substrate in which sidewalls extend to define the compartments;

the second substrate is composed of a material having a coefficient of thermal expansion at least substantially the same as that of the semiconductor material of the first substrate; and the optics elements are aligned with corresponding compartments.

4. The optical device of claim 3, wherein the second substrate is composed of silicon, glass, quartz and/or a III-V silicon material.

5. The optical device of claim 3, wherein the optics elements comprise lenses.

6. The optical device of claim 5, wherein the lenses comprise focus lenses and/or dispersion lenses having curved surfaces.

7. An optical device assembly for use with an imaging unit assembly having a plurality of microelectronic imaging dies on a first substrate composed of a semiconductor material, the imaging dies including imager sensors on the first substrate and integrated circuitry electrically coupled to the image sensors, the optical device assembly comprising:
- a plurality of stand-offs having sidewalls in a second substrate and compartments defined by the sidewalls, the second substrate being composed of a material having a coefficient of thermal expansion at least approximately the same as that of the semiconductor material of the first substrate, and the compartments being configured to contain corresponding image sensors on the first substrate; and
- a plurality of optics elements, the optics elements being formed in a plurality of etched surfaces in said second substrate, and being integral with the stand-offs such that there are no layers between the optics elements and the stand-offs and the optics elements are positioned in alignment with corresponding compartments.

8. The optical device assembly of claim 7, wherein the second substrate is composed of silicon, glass, quartz and/or a III-V silicon material.

9. The optical device assembly of claim 7, wherein the optics elements comprise lenses.

10. The optical device assembly of claim 9, wherein the lenses comprise focus lenses and/or dispersion lenses having curved surfaces.

11. A wafer-level imager assembly, comprising:
- an imager workpiece including a first substrate composed of a semiconductor material and a plurality of imaging dies on the first substrate, the imaging dies including imager sensors on the first substrate and integrated circuitry electrically coupled to the image sensors; and
- an optical device assembly including (a) a plurality of stand-offs having sidewalls in a second substrate and compartments defined by the sidewalls, the second substrate being composed of a material having a coefficient of thermal expansion at least approximately the same as that of the semiconductor material of the first substrate, and the compartments containing corresponding image sensors, and (b) a plurality of optics elements, the optics elements being formed in a plurality of depressions in said second substrate, and being integral with the stand-offs such that there are no layers between the optics elements and the stand-offs and the optics elements are positioned in alignment with corresponding compartments.

12. The wafer-level imager assembly of claim 11, wherein the second substrate is composed of silicon, glass, quartz and/or a II-V silicon material.

13. The wafer-level imager assembly of claim 11, wherein the optics elements comprise lenses.

14. The wafer-level imager assembly of claim 13, wherein the lenses comprise focus lenses and/or dispersion lenses having curved surfaces.

* * * * *

UNITED STATES PATENT AND TRADEMARK OFFICE
CERTIFICATE OF CORRECTION

PATENT NO. : 7,511,262 B2 Page 1 of 1
APPLICATION NO. : 11/209524
DATED : March 31, 2009
INVENTOR(S) : Akram It is certified that error appears in the above-identified patent and that said Letters Patent is hereby corrected as shown below:

On the title page, item (54), in column 1, line 2, delete "WAFER-LABEL" and insert -- WAFER-LEVEL --, therefor.

In column 1, line 2, delete "WAFER-LABEL" and insert -- WAFER-LEVEL --, therefor.

Signed and Sealed this

Seventh Day of July, 2009

JOHN DOLL
*Acting Director of the United States Patent and Trademark Office*